(12) United States Patent
Jeong et al.

(10) Patent No.: US 12,057,721 B2
(45) Date of Patent: Aug. 6, 2024

(54) BATTERY PROTECTION CIRCUIT AND BATTERY APPARATUS INCLUDING THE SAME

(71) Applicant: SAMSUNG SDI CO., LTD., Yongin-si (KR)

(72) Inventors: Hyeoncheol Jeong, Yongin-si (KR); Sanggu Lee, Yongin-si (KR); Kyongpil Jin, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 414 days.

(21) Appl. No.: 17/410,009

(22) Filed: Aug. 24, 2021

(65) Prior Publication Data

US 2022/0069609 A1 Mar. 3, 2022

(30) Foreign Application Priority Data

Aug. 31, 2020 (KR) .................. 10-2020-0110373

(51) Int. Cl.
*H02J 7/00* (2006.01)
*G01R 15/04* (2006.01)
*G01R 31/3835* (2019.01)

(52) U.S. Cl.
CPC .......... *H02J 7/00308* (2020.01); *G01R 15/04* (2013.01); *G01R 31/3835* (2019.01);
(Continued)

(58) Field of Classification Search
CPC .................. G01R 15/04; G01R 19/16542; G01R 31/382; G01R 31/3835; H01M 2200/00;
(Continued)

(56) References Cited

U.S. PATENT DOCUMENTS 5,637,413 A     6/1997    Fernandez et al.
5,695,886 A * 12/1997    Dewan .................. H01M 10/46
                                                        429/61

(Continued)

FOREIGN PATENT DOCUMENTS

EP         1 936 774 A1     6/2008
EP         3226375 B1 * 12/2018          H02H 7/18

(Continued)

OTHER PUBLICATIONS

U.S. Office action received in copending U.S. Appl. No. 17/409,980, mailed Mar. 16, 2023.

(Continued)

*Primary Examiner* — Jared Fureman
*Assistant Examiner* — Nicolas Bellido
(74) *Attorney, Agent, or Firm* — Lee IP Law, P.C.

(57) ABSTRACT

A battery protection circuit includes: a voltage divider connected in parallel to an outer terminal, and configured to output a divided voltage; a controller configured to output an overvoltage determination signal based on the divided voltage that is input thereto; a logic portion configured to output a switching control signal based on the overvoltage determination signal and the divided voltage that are input thereto; and a switching portion configured to control a connection between a battery module and the outer terminal according to the switching control signal.

13 Claims, 3 Drawing Sheets

(52) U.S. Cl.
CPC ........ *H02J 7/00302* (2020.01); *H02J 7/0031* (2013.01); *H02J 7/0024* (2013.01)

(58) Field of Classification Search
CPC .... H01M 50/574; H02H 7/18; H02J 7/00045; H02J 7/0024; H02J 7/00302; H02J 7/00308; H02J 7/0031; H02J 7/0047; Y02E 60/10
See application file for complete search history.

(56) References Cited

U.S. PATENT DOCUMENTS

| | | | |
|---|---|---|---|
| 5,890,780 | A | 4/1999 | Tomiyori |
| 6,208,117 | B1 | 3/2001 | Hibi |
| 11,817,728 | B2 * | 11/2023 | Jeong ............... H02J 7/0047 |
| 2004/0212350 | A1 * | 10/2004 | Patino ............... H02J 7/007194 320/134 |
| 2005/0212489 | A1 * | 9/2005 | Denning ............... H02J 7/0031 320/134 |
| 2009/0135633 | A1 | 5/2009 | Ikeuchi et al. |
| 2009/0268355 | A1 | 10/2009 | Wang |
| 2017/0288427 | A1 * | 10/2017 | Lo ............... H02J 7/00308 |
| 2018/0208066 | A1 | 7/2018 | Rao |
| 2020/0052346 | A1 | 2/2020 | Park |
| 2021/0143485 | A1 | 5/2021 | Kim et al. |
| 2022/0069608 | A1 * | 3/2022 | Jeong ............... H02J 7/00308 |

FOREIGN PATENT DOCUMENTS

| | | | |
|---|---|---|---|
| JP | 10-112939 | A | 4/1998 |
| JP | 2001-045670 | A | 2/2001 |
| JP | 2007-110853 | A | 4/2007 |
| JP | 2020-505899 | A | 2/2020 |
| JP | 2020-518096 | A | 6/2020 |
| KR | 10-2006-0059679 | A | 6/2006 |
| KR | 10-2010-0129141 | A | 12/2010 |
| KR | 10-2018-0008976 | A | 1/2018 |
| KR | 10-2019-0051477 | A | 5/2019 |
| KR | 10-2020-0028194 | A | 3/2020 |
| KR | 10-2093447 | B1 | 3/2020 |

OTHER PUBLICATIONS

Korean Office action dated Jul. 14, 2022.
Korean Notice of Allowance dated Jul. 27, 2022.
Japanese Office action dated Aug. 8, 2022.
Japanese Office action dated Aug. 15, 2022.
Extended European Search Report dated Dec. 7, 2021, for EP Application No. 21194091.1 which corresponds to U.S. Appl. No. 17/410,009.
Korean Office Action dated Jan. 17, 2022, for KR Patent Application No. 10-2020-0110373 which corresponds to U.S. Appl. No. 17/410,009.
Korean Office Action dated Jan. 17, 2022, for KR Patent Application No. 10-2020-0110372 which corresponds to U.S. Appl. No. 17/409,980.
Korean Notice of Allowance dated Dec. 26, 2022.
Japanese Office action dated Jan. 23, 2023.

* cited by examiner

BATTERY PROTECTION CIRCUIT AND BATTERY APPARATUS INCLUDING THE SAME

CROSS-REFERENCE TO RELATED APPLICATION

This application claims priority to and the benefit of Korean Patent Application No. 10-2020-0110373 filed in the Korean Intellectual Property Office on Aug. 31, 2020, the entire contents of which are incorporated herein by reference.

BACKGROUND

Field

Embodiments relate to a battery protection circuit and a battery apparatus including the same.

2. DESCRIPTION OF THE RELATED ART

Generally, a rechargeable battery that may be charged and discharged is combined with a circuit to configure a battery pack, and is charged and discharged through an outer terminal of the battery pack. When external power is connected through the outer terminal of the battery pack, a battery cell is charged by the external power supplied through the outer terminal and a charging/discharging circuit, and when the outer terminal and a load are connected, power of the battery cell is supplied to the load through the charging/discharging circuit and the outer terminal.

The above information disclosed in this Background section is only for enhancement of understanding, and therefore it may contain information that does not form the prior art that is already known in this country to a person of ordinary skill in the art.

SUMMARY

An embodiment is directed to a battery protection circuit, including: a voltage divider connected in parallel to an outer terminal, and configured to output a divided voltage; a controller configured to output an overvoltage determination signal based on the divided voltage that is input thereto; a logic portion configured to output a switching control signal based on the overvoltage determination signal and the divided voltage that are input thereto; and a switching portion configured to control a connection between a battery module and the outer terminal according to the switching control signal.

The logic portion may include an AND gate and an inverter, the inverter may receive the divided voltage from the voltage divider, and outputs an inverter output signal to the AND gate, and the AND gate may receive the overvoltage determination signal and the inverter output signal to output the switching control signal.

When the divided voltage is greater than or equal to a predetermined first voltage, the inverter output signal and the overvoltage determination signal may be low level signals.

The switching portion may be opened by the switching control signal when the switching control signal is a low level signal.

When the divided voltage is less than a predetermined first voltage, the inverter output signal and the overvoltage determination signal may be high level signals.

The switching portion may be closed by the switching control signal when the switching control signal is a high level signal.

When the divided voltage is input according to a predetermined time sequence, the controller may determine that an external device connected to the outer terminal is a dedicated charger, and may output the overvoltage determination signal so that the logic portion outputs the switching control signal to connect the battery module with the outer terminal.

An embodiment is directed to a battery module protecting method, including: receiving, by a voltage divider, a voltage from an outer terminal, to provide a divided voltage; outputting, by a controller, an overvoltage determination signal based on the divided voltage that is input thereto; outputting, by a logic portion, a switching control signal based on the overvoltage determination signal and the divided voltage that are input thereto; and controlling, by a switching portion, a connection between a battery module and the outer terminal according to the switching control signal.

The logic portion may include an AND gate and an inverter; and the outputting, by the logic portion, of the switching control signal may include: transmitting, by the inverter, an inverter output signal to the AND gate based on the divided voltage input thereto, and outputting, by the AND gate, the switching control signal based on the overvoltage determination signal and the inverter output signal that are input thereto.

When the divided voltage is greater than or equal to a predetermined first voltage, the inverter output signal and the overvoltage determination signal may be low level signals.

The battery module protecting method may further include disconnecting, by the switching portion, the battery module and the outer terminal according to the switching control signal when the switching control signal is a low level signal.

When the divided voltage is less than a predetermined first voltage, the inverter output signal and the overvoltage determination signal may be high level signals.

The battery module protecting method may further include connecting, by the switching portion, the battery module and the outer terminal according to the switching control signal when the switching control signal is a high level signal.

The receiving, by the voltage divider, of the voltage from the outer terminal may include receiving a voltage according to a predetermined time sequence from the outer terminal; and the outputting, by the controller, of the overvoltage determination signal may include: determining, by the controller, that an external device connected to the outer terminal is a dedicated charger when the divided voltage is input thereto according to the predetermined time sequence; and outputting, by the controller, the overvoltage determination signal so that the logic portion outputs the switching control signal to connect the battery module with the outer terminal.

An embodiment is directed to a battery apparatus, including: a battery module; an outer terminal configured to connect an external device to the battery module; and a battery protection circuit, the battery protection circuit including: a voltage divider connected in parallel to the outer terminal, and configured to output a divided voltage; a controller configured to output an overvoltage determination signal based on the divided voltage that is input thereto; a logic portion configured to output a switching control signal based on the overvoltage determination signal and the divided voltage that are input thereto; and a switching portion configured to control a connection between the battery module and the outer terminal according to the switching control signal.

BRIEF DESCRIPTION OF THE DRAWINGS

Features will become apparent to those of skill in the art by describing in detail example embodiments with reference to the attached drawings in which.

DETAILED DESCRIPTION

Figure 1:
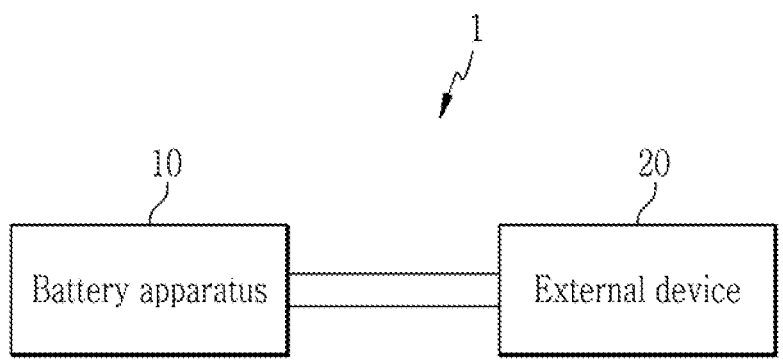
FIG. 1 illustrates a block diagram of a battery charging/discharging system according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

The terms "module" and "unit, portion, or part" representing constituent elements used in the following description are used only in order to make understanding of the specification easier, and thus, these terms do not have meanings or roles that distinguish them from each other by themselves.

In the present specification, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

FIG. 1 schematically illustrates a block diagram of a battery charging/discharging system 1 according to an example embodiment.

Referring to FIG. 1, the battery charging/discharging system 1 may include a battery apparatus 10 and an external device 20.

The battery apparatus 10 has a structure that may be electrically connected to the external device 20. When the external device 20 is a charger, the battery apparatus 10 receives external power through the charger 20 and is charged. When the external device 20 is a load, the battery apparatus 10 operates as a power supply that supplies power to the load 20 and is discharged.

Figure 2:
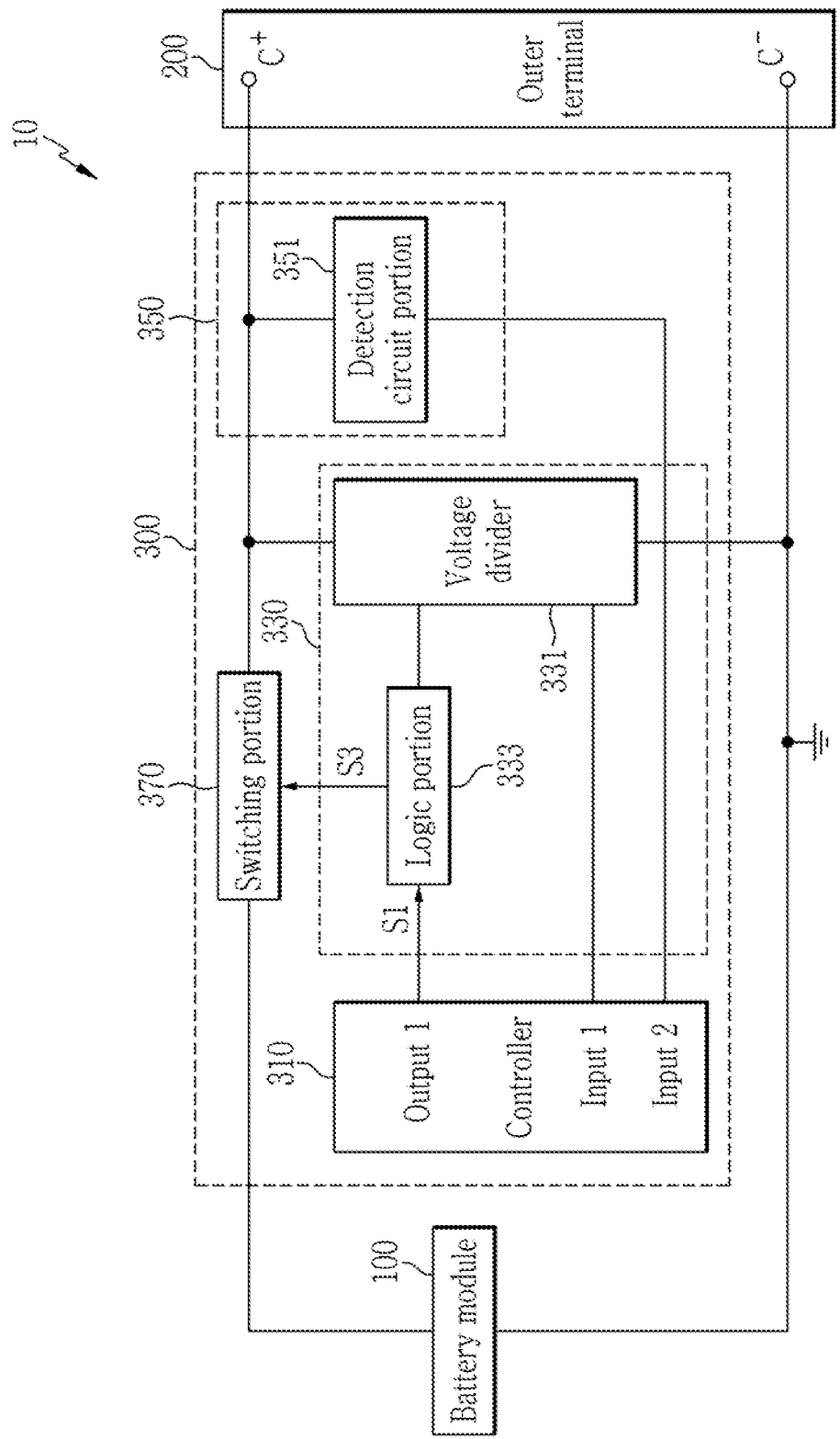
FIG. 2 illustrates a battery apparatus according to an example embodiment.

FIG. 2 illustrates a battery apparatus 10 according to an example embodiment.

The battery apparatus 10 according to the present example embodiment may include a battery module 100, an outer terminal 200, and a protection circuit 300.

Figure 3:
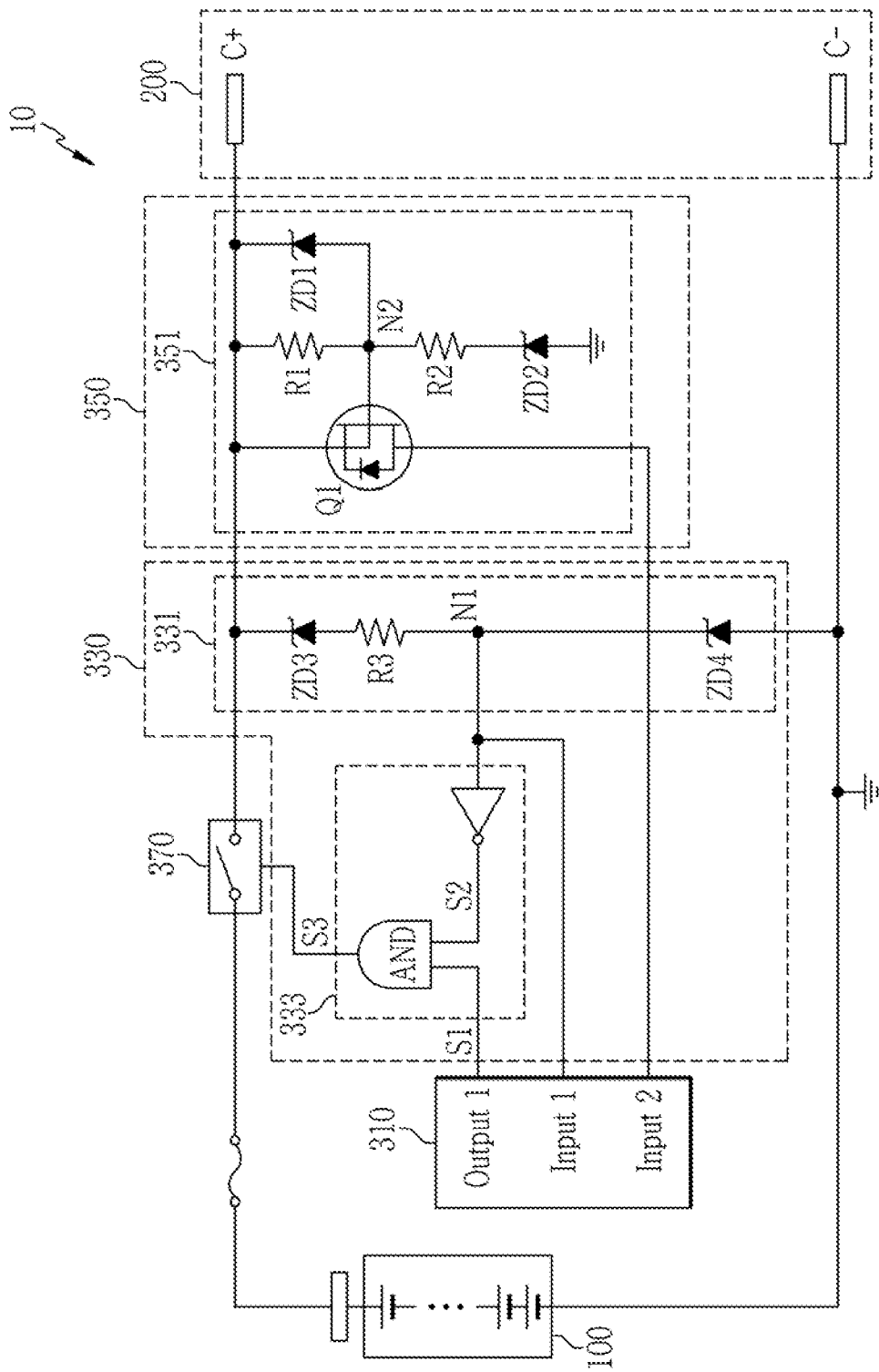
FIG. 3 illustrates a schematic circuit diagram of a battery apparatus according to an example embodiment.

The battery module 100 may include a plurality of battery cells (see FIG. 3). In an example embodiment, each battery cell may be a rechargeable battery. A predetermined number of battery cells may be connected, e.g., in series, to configure the battery module 100.

The outer terminal 200 is a terminal for connecting the external device 20 (see FIG. 1) to the battery apparatus 10.

The protection circuit 300 may operate to control a connection between the battery module 100 and the outer terminal 200. In the case that an overvoltage charger is connected to the outer terminal 200, the protection circuit 300 may operate to prevent an overcharge current from flowing by blocking the battery module 100 from being charged. In addition, the protection circuit 300 may block a current from being output from the battery module 100, e.g., in the case that a low voltage load is connected to the outer terminal 200.

The protection circuit 300 may include a controller 310, an overvoltage charging protection portion 330, a low voltage detection circuit portion 350, and a switching portion 370.

The controller 310 may control an operation of the battery apparatus 10 by acquiring basic data for checking a state of the battery apparatus 10. The controller 310 may control a connection between the battery module 100 and the outer terminal 200 to control charging and discharging of the battery module 100. For example, the controller 310 may output one or more signals used in control of the switching portion 370.

The overvoltage charging protection portion 330 may disconnect the battery module 100 from the outer terminal 200 by turning off the switching portion 370 to secure safety of the battery module 100 if an overvoltage charger is connected to the outer terminal 200.

The overvoltage charging protection portion 330 may include a voltage divider 331 and a logic portion 333.

One end of the voltage divider 331 may be connected to a positive connection terminal C(+) of the outer terminal 200 and the other end of the voltage divider 331 may be connected to a negative connection terminal C(−) of the outer terminal 200 or ground. The voltage divider 331 may divide a voltage input to the outer terminal 200, e.g., a voltage across the positive connection terminal C(+) and the negative connection terminal C(−), at a predetermined ratio to transmit a divided voltage to the controller 310 (e.g., at Input 1 of the controller 310) and the logic portion 333.

The controller 310 may output (e.g., at Output 1) an overvoltage determination signal S1 to the logic portion 333 based on comparing the divided voltage (received at Input 1 of the controller 310) from the voltage divider 331 with a predetermined overvoltage level voltage value therein. When the divided voltage is equal to or greater than the overvoltage level voltage value, the overvoltage determination signal S1 may be a disable signal. When the divided voltage is less than the overvoltage level voltage value, the overvoltage determination signal S1 may be an enable signal. Hereinafter, for ease of description, it is assumed that the enable signal is S1 at a high level signal ("1") and the disable signal is S1 at a low level signal ("0").

The controller 310 may store information on a dedicated charger according to a type of the battery module 100. For example, information about a method by which a dedicated charger of the battery module 100 applies a voltage may be stored therein. When the divided voltage input to the controller 310 from the voltage divider 331 follows a predetermined time sequence, the controller 310 may determine whether the time sequence of the input voltage is the same as that of the dedicated charger of the battery module 100, and may recognize that the external device 20 connected to the outer terminal 200 is a dedicated charger. In this case, the controller 310 may directly transmit a switching control signal for turning on the switching portion 370 to the switching portion 370.

The logic portion 333 may receive as first input the overvoltage determination signal S1 from the controller 310 (e.g., via Output 1 of the controller 310) and as a second input the divided voltage from the voltage divider 331, and may output a switching control signal S3 to the switching portion 370.

The low voltage detection circuit portion 350 may include a detection circuit portion 351. When a low voltage is input to the outer terminal 200 (e.g., a low input voltage at the positive connection terminal C(+) of the outer terminal 200 due to noise and the like), the low voltage detection circuit portion 350 may prevent the controller 310 from waking up, e.g., in order to reduce energy consumption of the battery module, thereby preventing the connection between the battery module 100 and the outer terminal 200. The detection circuit portion 351 may include a transistor Q1 (see FIG. 3) operating based on a predetermined low voltage level voltage value.

The switching portion 370 may be connected in series between the battery module 100 and the outer terminal 200, and may operate to control the electrical connection between the battery module 100 and the outer terminal 200. For example, the switching portion 370 may be connected between a positive output terminal of the battery module 100 (to which the positive voltage of the battery module 100 is output) and the positive connection terminal C(+) of the outer terminal 200, which is connected to the external device 20. The switching portion 370 may be controlled by at least one of a signal transmitted from the controller 310 and the switching control signal S3 output from the logic portion 333.

FIG. 3 illustrates a schematic circuit diagram of a battery apparatus 10 showing an overvoltage charging protection portion 330, a low voltage detection circuit portion 350, and a switching portion 370, according to an example embodiment.

In the overvoltage charging protection portion 330, the voltage divider 331 may include at least two Zener diodes ZD3 and ZD4 and a resistor R3. The at least two Zener diodes ZD3 and ZD4 and the resistor R3 may be connected in series (as ZD3-R3-ZD4) across the outer terminal 200, e.g., between the positive connection terminal C(+) of the outer terminal 200 and the negative connection terminal C(−) of the outer terminal 200 or a ground. The voltage divider 331 may adjust respective values of the at least two Zener diodes ZD3 and ZD4 and the resistor R3 to determine a voltage division ratio. The voltage divider 331 may transmit, to the logic portion 333 and the controller 310 (e.g., at Input 1 thereof), a divided voltage that is a voltage of a node N1 located between the resistor R3 and the Zener diode ZD4, e.g., a voltage between the positive connection terminal C(+) of the outer terminal 200 and the ground that is divided at the voltage division ratio.

The logic portion 333 may include an inverter and an AND gate.

The inverter may output an inverter output signal S2 according to the divided voltage from the voltage divider 331. A preset threshold is stored in the inverter. Here, the preset threshold value may be an overvoltage level voltage value. The inverter may compare the voltage input to the inverter with a threshold value stored in advance, and when a voltage input to the inverter is equal to and greater than a preset threshold, it may output a disable signal. In addition, when the voltage input to the inverter is less than the preset threshold, it may output an enable signal Hereinafter, for ease of description, it is assumed that the disable signal of the inverter is S2 at a low level signal ("0") and the enable signal thereof is S2 at a high level signal "1". The enable signal of the overvoltage determination signal S1 of the controller 310 and the enable signal of the inverter output signal S2 may be the same level signal, e.g., both being a high level signal, and the disable signal of the overvoltage determination signal S1 and the disable signal of the inverter output signal S2 may also be the same level signal, e.g., both being a low level signal.

The AND gate is a logic element that performs logical multiplication. The AND gate outputs the switching control signal S3 by performing a logical product between the overvoltage determination signal S1 from the controller 310 and the inverter output signal S2. The output S3 of the AND gate is shown in Table 1.

TABLE 1

| AND Input S1 | AND Input S2 | AND Output S3 |
|---|---|---|
| 0 | 0 | 0 |
| 0 | 1 | 0 |
| 1 | 0 | 0 |
| 1 | 1 | 1 |

The switching portion 370 may be opened or closed by the switching control signal S3 output from the logic portion 333. For example, when the switching control signal S3 is a high level signal ("1"), the switching portion 370 may be closed (conductive) so that the battery module 100 and the outer terminal 200 may be connected. On the other hand, when the switching control signal S3 is a low level signal ("0"), the switching portion 370 may be opened (nonconductive) so that the battery module 100 and the outer terminal 200 may not be connected.

Additional details of operation of the overvoltage charging protection portion 330 and the switching portion 370 will be described later.

In the low voltage detection circuit portion 350, the detection circuit portion 351 may include at least two Zener diodes ZD1 and ZD2, resistors R1 and R2, and a transistor Q1. The resistor R1, the resistor R2, and the Zener diode ZD2 may be connected in series (as R1-R2-ZD2) between the positive connection terminal C(+) of the outer terminal 200 and the ground. The Zener diode ZD1 may be connected between the positive connection terminal C(+) of the outer terminal 200 and a node N2 located between the resistor R1 and the resistor R2. The transistor Q1 may be connected to control a connection between the positive connection terminal C(+) of the outer terminal 200 and the controller 310 (e.g., Input 2 of the controller 310), and may be controlled by a voltage of the node N2.

Additional details of operation of the low voltage detection circuit portion 350 will be described later.

Hereinafter, the operation of the overvoltage charging protection portion 330 will be described in detail with reference to FIG. 3.

In the overvoltage charging protection portion 330, a voltage Vz(ZD4) of the node N1 is input to an input terminal (Input 1) of the controller 310 and to the inverter. When the voltage Vz(ZD4) of the node N1 is greater than or equal to a predetermined overvoltage level voltage value, the controller 310 may output the overvoltage determination signal S1 of a low level through an output terminal (Output 1). Also, when the voltage Vz(ZD4) of the node N1 is greater than or equal to the predetermined overvoltage level voltage value, the inverter may output the inverter output signal S2 of a low level. In this case, the logic portion 333 may output the switching control signal S3 of a low level.

When the voltage Vz(ZD4) of the node N1 is less than a predetermined overvoltage level voltage value, the controller 310 may output the overvoltage determination signal S1 of a high level through the output terminal (Output 1). Also, when the voltage Vz(ZD4) of the node N1 is less than the predetermined overvoltage level voltage value, the inverter may output the inverter output signal S2 of a high level. In this case, the logic portion 333 may output the switching control signal S3 of a high level.

Explaining to the above in greater detail, and denoting the voltage input to the positive connection terminal C(+) of the outer terminal 200 as A(V), if A(V)≥(Vz(ZD3)+Vz(ZD4)), then the voltage Vz(ZD4) of the node N1 is greater than or equal to the predetermined overvoltage level voltage value. Accordingly, both the overvoltage determination signal S1 and the inverter output signal S2 of the controller 310 are low level signals. Accordingly, the logic portion 333 outputs the switching control signal S3 of the low level, and thus the switching portion 370 is not closed. Further, even if the controller 310 does not properly operate, since the inverter output signal S2 is a low level signal, the logic portion 333 outputs the low level switching control signal S3 regardless of the overvoltage determination signal S1, and thus the switching portion 370 is not closed.

On the other hand, if the voltage A(V) that is input to the positive connection terminal C(+) of the outer terminal 200 satisfies A(V)<(Vz(ZD3)+Vz(ZD4)), then the voltage Vz(ZD4) of the node N1 is less than the overvoltage level voltage value. Accordingly, both the overvoltage determination signal S1 from the controller 310 and the inverter output signal S2 are high level signals. Accordingly, the logic portion 333 outputs the switching control signal S3 of the high level, and thus the switching portion 370 is closed so that the battery module 100 and the outer terminal 200 are connected to each other.

When the dedicated charger of the battery module 100 is connected to the outer terminal 200, the dedicated charger may input a voltage to the outer terminal 200 according to a predetermined time sequence. When the voltage that is input to the input terminal of the controller 310 (at Input 1) follows the predetermined time sequence, the controller 310 may recognize that the external device 20 connected to the outer terminal 200 is the dedicated charger 20, and may directly transmit a switching control signal for turning on the switching portion 370 to the switching portion 370. For example, when periods for maintaining the overvoltage level voltage value or more and periods for maintaining the overvoltage level voltage value or less are alternately input three or more times, the controller 310 may determine that the dedicated charger of the battery module 100 is connected. Accordingly, the controller 310 may directly transmit a switching control signal for turning on the switching portion 370 to the switching portion 370.

Above, it has been described that the reference voltages used as the threshold for the inverter and the controller 310 to detect the overvoltage state have the same reference as the overvoltage level voltage value, but the reference voltages may have different values.

Hereinafter, an operation of the low voltage detection circuit portion 350 will be described in detail with reference to FIG. 3.

A low voltage may be input to positive connection terminal C(+) of the outer terminal 200 of the battery apparatus 10 by noise, e.g., from a human hand. In this case, denoting the input voltage as B(V), and a breakdown voltage of the transistor Q1 of the detection circuit portion 351 is referred to as Vth(Q1), it can be understood that a voltage of the node N2 (that is, a voltage applied to a gate of the transistor Q1) is:

$$\{B(V)-Vz(ZD2)\} \times R1 \div (R2+R1).$$

If a breakdown voltage Vth(Q1) of the transistor Q1 is greater than the voltage of the node N2, i.e., when the voltage input to the outer terminal 200 is higher than a predetermined low voltage level voltage value, then the transistor Q1 is turned on, so that a current flows from the outer terminal 200 to the input terminal (input 2) of the controller 310, and a wake-up signal is transmitted to the controller 310. Accordingly, the controller 310 may output a switching control signal according to the voltage B(V) input to the outer terminal 200.

On the other hand, if the breakdown voltage Vth(Q1) of the transistor Q1 is smaller than a voltage applied to the gate thereof, i.e., when the voltage input to the outer terminal 200 is lower than the predetermined low voltage level voltage value, then the transistor Q1 is not turned on, the wake-up signal is not transmitted to the input terminal (input 2) of the controller 310, and the controller 310 does not operate.

The overvoltage charging protection portion 330 and the low voltage detection circuit portion 350 according to the above-described embodiments may be mounted on a single printed circuit board (PCB) to be combined with the battery module 100, and they may be respectively mounted on a separate printed circuit board to be combined with the battery module 100.

As described above, a battery apparatus according to embodiments may operate to protect the battery apparatus from an overcharge current flowing if an overvoltage charger is connected to the battery apparatus, may protect a battery apparatus from an overcharge current even when a battery management system does not operate, and/or may recognize a dedicated charger without a separate terminal, so that there is no need to manufacture an additional circuit, thereby reducing costs.

The steps constituting the method according to the embodiments may be performed in an appropriate order unless explicitly stated or contradicted by the order, and embodiments are not limited to the described order of the steps.

By way of summation and review, various types of charging/discharging abnormalities may occur in a battery pack, such as an overcharging current due to an overvoltage charger connection, an overdischarging current flowing from the battery pack to the outside, etc., and thus a battery pack may be provided with a separate terminal for recognizing a dedicated charger, and may be provided with a protection circuit to block overcharging and overdischarging of the battery pack when the battery pack is abnormally charged or discharged. If the protection circuit is implemented with a switch to control a connection between the battery pack and an external electronic device, a processor of a battery management system may continuously transmit a control signal to the switch so that the switch is maintained in an on state. In this case, the switch may not be controlled if a fault occurs in the processor.

As described above, an embodiment may provide a battery apparatus that may recognize a dedicated charger without a separate terminal, which may avoid using an additional circuit, thereby reducing costs. An embodiment may provide a battery apparatus that includes a protective circuit for preventing damage from an overvoltage charger being connected thereto. A battery apparatus according to an embodiment may protect a battery apparatus from an overcharge current, e.g., if an overvoltage charger is connected to the battery apparatus, even when a battery management system does not operate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery protection circuit, comprising:
   a voltage divider connected in parallel to an outer terminal, and configured to output a divided voltage;
   a controller configured to output an overvoltage determination signal based on the divided voltage that is input thereto;
   a logic portion configured to output a switching control signal based on the overvoltage determination signal and the divided voltage that are input thereto, wherein the logic portion includes an AND gate and an inverter, the inverter receives the divided voltage from the voltage divider, and outputs an inverter output signal to the AND gate, and the AND gate receives the overvoltage determination signal and the inverter output signal to output the switching control signal; and
   a switching portion configured to control a connection between a battery module and the outer terminal according to the switching control signal.

2. The battery protection circuit as claimed in claim 1, wherein, when the divided voltage is greater than or equal to a predetermined first voltage, the inverter output signal and the overvoltage determination signal are low level signals.

3. The battery protection circuit as claimed in claim 2, wherein the switching portion is opened by the switching control signal when the switching control signal is a low level signal.

4. The battery protection circuit as claimed in claim 1, wherein, when the divided voltage is less than a predetermined first voltage, the inverter output signal and the overvoltage determination signal are high level signals.

5. The battery protection circuit as claimed in claim 4, wherein the switching portion is closed by the switching control signal when the switching control signal is a high level signal.

6. The battery protection circuit as claimed in claim 1, wherein the controller determines that an external device connected to the outer terminal is a dedicated charger, and outputs the overvoltage determination signal so that the logic portion outputs the switching control signal to connect the battery module with the outer terminal.

7. A battery module protecting method, comprising:
   receiving, by a voltage divider, a voltage from an outer terminal, to provide a divided voltage;
   outputting, by a controller, an overvoltage determination signal based on the divided voltage that is input thereto;
   outputting, by a logic portion, a switching control signal based on the overvoltage determination signal and the divided voltage that are input thereto, wherein the logic portion includes an AND gate and an inverter, wherein the outputting, by the logic portion, of the switching control signal includes:
      transmitting, by the inverter, an inverter output signal to the AND gate based on the divided voltage input thereto, and
      outputting, by the AND gate, the switching control signal based on the overvoltage determination signal and the inverter output signal that are input thereto; and
   controlling, by a switching portion, a connection between a battery module and the outer terminal according to the switching control signal.

8. The battery module protecting method as claimed in claim 7, wherein, when the divided voltage is greater than or equal to a predetermined first voltage, the inverter output signal and the overvoltage determination signal are low level signals.

9. The battery module protecting method as claimed in claim 8, further comprising disconnecting, by the switching portion, the battery module and the outer terminal according to the switching control signal when the switching control signal is a low level signal.

10. The battery module protecting method as claimed in claim 7, wherein, when the divided voltage is less than a predetermined first voltage, the inverter output signal and the overvoltage determination signal are high level signals.

11. The battery module protecting method as claimed in claim 10, further comprising connecting, by the switching portion, the battery module and the outer terminal according to the switching control signal when the switching control signal is a high level signal.

12. The battery module protecting method as claimed in claim 7, wherein the outputting, by the controller, of the overvoltage determination signal includes:
    determining, by the controller, that an external device connected to the outer terminal is a dedicated charger when the divided voltage is input thereto according to the predetermined time sequence; and
    outputting, by the controller, the overvoltage determination signal so that the logic portion outputs the switching control signal to connect the battery module with the outer terminal.

13. A battery apparatus, comprising:
    a battery module;
    an outer terminal configured to connect an external device to the battery module; and
    a battery protection circuit, the battery protection circuit including:
    a voltage divider connected in parallel to the outer terminal, and configured to output a divided voltage;
    a controller configured to output an overvoltage determination signal based on the divided voltage that is input thereto;
    a logic portion configured to output a switching control signal based on the overvoltage determination signal and the divided voltage that are input thereto, wherein the logic portion includes an AND gate and an inverter, the inverter receives the divided voltage from the voltage divider, and outputs an inverter output signal to the AND gate, and the AND gate receives the overvoltage determination signal and the inverter output signal to output the switching control signal; and
    a switching portion configured to control a connection between the battery module and the outer terminal according to the switching control signal.

* * * * *